(12) United States Patent
Liu et al.

(10) Patent No.: US 12,470,121 B2
(45) Date of Patent: Nov. 11, 2025

(54) FAIL-SAFE INPUT/OUTPUT DEVICE AND VOLTAGE SWITCHING METHOD

(71) Applicant: SigmaStar Technology Ltd., Fujian (CN)

(72) Inventors: Chi-Yun Liu, Taiwan (TW); Wei-Ping Wang, Taiwan (TW); Chang-Han Li, Taiwan (TW)

(73) Assignee: SIGMASTAR TECHNOLOGY LTD., Fujian (CN)

( * ) Notice: Subject to any disclaimer, the term of this patent is extended or adjusted under 35 U.S.C. 154(b) by 225 days.

(21) Appl. No.: 18/527,708

(22) Filed: Dec. 4, 2023

(65) Prior Publication Data

US 2024/0243651 A1 Jul. 18, 2024

(30) Foreign Application Priority Data

Jan. 18, 2023 (CN) .......................... 202310078675.7

(51) Int. Cl.
*H02M 1/00* (2007.01)
*H02M 3/155* (2006.01)

(52) U.S. Cl.
CPC ......... *H02M 1/0032* (2021.05); *H02M 3/155* (2013.01)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/157; H02M 3/158; H02M 1/346; H02M 3/1588; H02M 2003/1566;
(Continued)

(56) References Cited

U.S. PATENT DOCUMENTS

| | | | |
|---|---|---|---|
| 12,265,411 B2 * | 4/2025 | Tsao | H03K 19/018521 |
| 2022/0286117 A1 * | 9/2022 | Tsai | H03K 3/0377 |
| 2024/0386865 A1 * | 11/2024 | Liu | G09G 3/3696 |

* cited by examiner

*Primary Examiner* — Jeffrey A Gblende
(74) *Attorney, Agent, or Firm* — Edell, Shapiro & Finnan, LLC

(57) ABSTRACT

A fail-safe input/output device includes an input/output circuit, a comparator circuit and a resistance adjustment circuit. The input/output circuit transmits a voltage having a higher voltage level in a first supply voltage and a second supply voltage to a first node to generate a driving voltage, wherein a first target level of the first supply voltage is lower than a second target level of the second supply voltage. The comparator circuit compares the first supply voltage with the second supply voltage to generate a control signal, and selectively transmits the first supply voltage to the first node according to the control signal. The resistance adjustment circuit adjusts a resistance between the first node and a second node according to the second supply voltage, wherein the input/output circuit transmits the second supply voltage to the first node via the second node.

10 Claims, 8 Drawing Sheets

(58) Field of Classification Search
CPC ............ H02M 3/1582; H02M 3/1584; H02M 2003/1557; H02M 1/0032; H02M 1/4225; H02M 7/217; H02M 1/0025; H02M 1/0045; H02M 1/0009; H02M 1/08; H02M 1/088; H02M 1/0048; H05B 39/048; B23K 11/24; H04B 2215/069
See application file for complete search history.

500

S510
Transmit voltage having higher level in first supply voltage and second supply voltage by input/output circuit to first node to generate driving voltage, wherein first target level of first supply voltage is lower than second target level of second supply voltage

S520
Compare first supply voltage with second supply voltage to generate control signal, and selectively transmit first supply voltage to first node according to control signal

S530
Adjust resistance between first node and second node according to second supply voltage, wherein input/output circuit transmits second supply voltage to first node via second node

FIG. 5

FAIL-SAFE INPUT/OUTPUT DEVICE AND VOLTAGE SWITCHING METHOD

This application claims the benefit of China application Serial No. CN202310078675.7, filed on Jan. 18, 2023, the subject matter of which is incorporated herein by reference.

BACKGROUND OF THE INVENTION

Field of the Invention

The present application relates to an input/output device, and more particularly to an input/output device having a fail-safe mechanism and a voltage switching method.

Description of the Related Art

In certain circuit applications, power is supplied from multiple supply voltages having different levels. For example, when a system operates in a high performance mode, the system may be powered by a higher supply voltage so as to enhance the performance of circuits. Alternatively, when the system operates in a power-saving mode, the system may be powered by a lower supply voltage so as to reduce power consumption. During power-on of a system, supply voltages having different levels continue to switch to respective target levels from low levels. In certain techniques, an input/output device needs to select an appropriate voltage from these supply voltages to first drive other circuits in the system. In some related art, when an input/output device outputs a supply voltage during power-on, it is possible that an improper operation such as current backflow or two simultaneously selected supply voltages occurs, incurring an unexpected voltage drop or jump in a driving voltage or supply voltages. As a result, some circuits in the system may become unstable, causing degraded system reliability.

SUMMARY OF THE INVENTION

In some embodiments, it is an object of the present application to provide a fail-safe input/output device and a voltage switching method so as to improve the drawbacks of the prior art.

In some embodiments, a fail-safe input/output device includes an input/output circuit, a comparator circuit and a resistance adjustment circuit. The input/output circuit transmits a voltage having a higher voltage level in a first supply voltage and a second supply voltage to a first node to generate a driving voltage, wherein a first target level of the first supply voltage is lower than a second target level of the second supply voltage. The comparator circuit compares the first supply voltage with the second supply voltage to generate a control signal, and selectively transmits the first supply voltage to the first node according to the control signal. The resistance adjustment circuit adjusts a resistance between the first node and a second node according to the second supply voltage, wherein the input/output circuit transmits the second supply voltage to the first node via the second node.

In some embodiments, the voltage switching method includes the following operations: transmitting a voltage having a higher voltage level in a first supply voltage and a second supply voltage to a first node to generate a driving voltage, wherein a first target level of the first supply voltage is lower than a second target level of the second supply voltage; comparing the first supply voltage with the second supply voltage to generate a control signal, and selectively transmitting the first supply voltage to the first node according to the control signal; and adjusting a resistance between the first node and a second node according to the second supply voltage, wherein the input/output circuit transmits the second supply voltage to the first node via the second node.

Features, implementations and effects of the present application are described in detail in preferred embodiments with the accompanying drawings below.

BRIEF DESCRIPTION OF THE DRAWINGS

To better describe the technical solution of the embodiments of the present application, drawings involved in the description of the embodiments are introduced below. It is apparent that, the drawings in the description below represent merely some embodiments of the present application, and other drawings apart from these drawings may also be obtained by a person skilled in the art without involving inventive skills.

FIG. 5 is a flowchart of a voltage switching method according to some embodiments of the present application.

DETAILED DESCRIPTION OF THE INVENTION

All terms used in the literature have commonly recognized meanings. Definitions of the terms in commonly used dictionaries and examples discussed in the disclosure of the present application are merely exemplary, and are not to be construed as limitations to the scope or the meanings of the present application. Similarly, the present application is not limited to the embodiments enumerated in the description of the application.

The term "coupled" or "connected" used in the literature refers to two or multiple elements being directly and physically or electrically in contact with each other, or indirectly and physically or electrically in contact with each other, and may also refer to two or more elements operating or acting with each other. As given in the literature, the term "circuit" may be a device connected by at least one transistor and/or at least one active element by a predetermined means so as to process signals.

Figure 1:
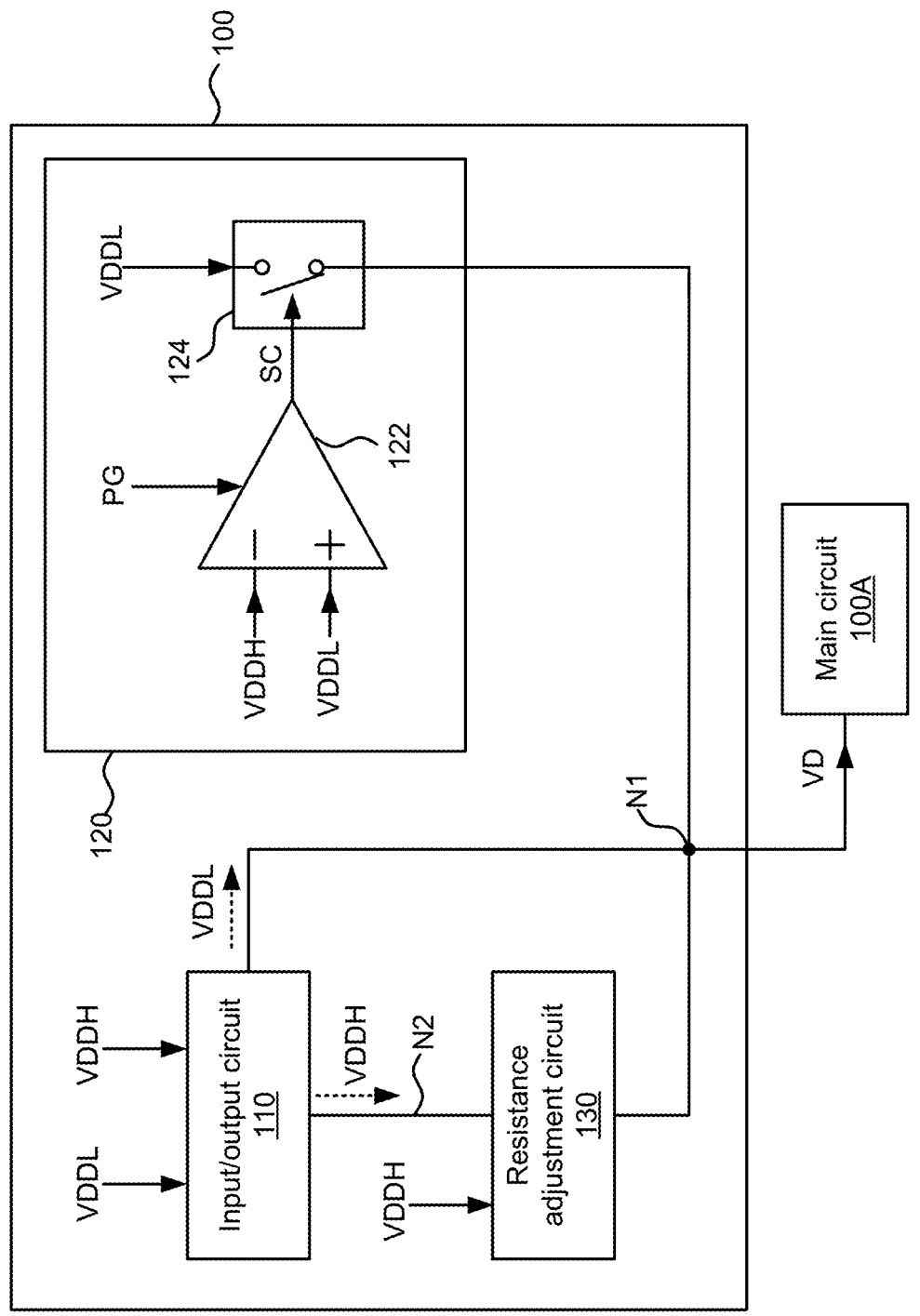
FIG. 1 is a schematic diagram of a fail-safe input/output device according to some embodiments of the present application.

FIG. 1 shows a schematic diagram of a fail-safe input/output device 100 according to some embodiments of the present application. In some embodiments, the fail-safe device 100 is applicable in a system having multiple supply voltages. For example, as shown in FIG. 1, the fail-safe device 100 may output one of a supply voltage VDDH and a supply voltage VDDL as a driving voltage VD so drive a main circuit 100A, wherein a first target level of the supply voltage VDDL is lower than a second target level of the supply voltage VDDH. For example, a first target level of the supply voltage VDDL may be approximately 1 V, and the second target level of the supply voltage VDDH may be approximately 3.3 V. It should be noted that the above numerical values of the target levels are merely examples, and the present application is not limited to these examples. In some embodiments, the main circuit 100A may include one or more P-type transistors, wherein bases of the P-type transistors may be biased by the driving voltage VD. In some embodiments, the main circuit 100A may include one or more digital circuits and is driven by the driving voltage VD (that is, the one or more digital circuits are driven by the driving voltage VD).

The fail-safe input/output device 100 includes an input/output circuit 110, a comparator circuit 120 and a resistance adjustment circuit 130. The input/output circuit 110 may transmit a voltage having a higher voltage level in the supply voltage VDDH and the supply voltage VDDL to a node N1 (for example, an output terminal for outputting the driving voltage VD) to generate the driving voltage VD. For example, during power-on, if the level of the supply voltage VDDL is higher than the level of the supply voltage VDDH (for example but not limited to, the supply voltage VDDL has risen to the first target level and the level of the supply voltage VDDH is still lower than that of the supply voltage VDDL), the input/output circuit 110 may output the supply voltage VDDL as the driving voltage VD. Alternatively, if the supply voltage VDDH has risen to the second target level and is higher than the supply voltage VDDL, the input/output circuit 110 may output the supply voltage VDDH as the driving voltage VD.

The comparator circuit 120 may compare the supply voltage VDDH with the supply voltage VDDL to generate a control signal SC, and selectively transmit the supply voltage VDDL to the node N1 according to the control signal SC. For example, the comparator circuit 120 includes a comparator 122 and a switch 124. The comparator 122 may compare the supply voltage VDDH with the supply voltage VDDL according to the detection signal PG so as to generate the control signal SC. For example, when the detection signal PG is at a first logic level (for example, logic 0), the comparator 122 is enabled to compare the supply voltage VDDH with the supply voltage VDDL so as to generate the control signal SC and to further selectively turn on the switch 124. Alternatively, when the detection signal PG is at a second logic level (for example, logic 1), the comparator 122 is disabled and the switch 124 is turned off.

The resistance adjustment circuit 130 may adjust the resistance between the node N1 and a node N2 according to the supply voltage VDDH, wherein the input/output circuit 110 may transmit the supply voltage VDDH to the node N1 via the node N2, that is, the node N2 may serve as an output terminal of the input/output circuit 110 for outputting the supply voltage VDDH. In some embodiments, at least one of the resistance adjustment circuit 130 and/or the comparator circuit 120 may be selectively disabled according to the detection signal PG, wherein the detection signal PG may be used to indicate whether the supply voltage VDDH is stably higher than or equal to the second target level and to indicate whether the supply voltage VDDL is stably higher than or equal to the first target level. For example, a voltage detection circuit (not shown) may be used to confirm whether power-on of both of the supply voltage VDDH and the supply voltage VDDL is completed (for example, stably higher than or equal to the corresponding first or second target level), so as to generate the detection signal PG. If either of the supply voltages VDDH and the supply voltage VDDL is not higher than or equal to the corresponding first or second target level, the voltage detection circuit may output the detection signal PG having a first logic level. In this case, the resistance adjustment circuit 130 and/or the comparator circuit 120 may be enabled according to the detection signal PG so as to perform corresponding operations. Alternatively, if both of the supply voltage VDDH and the supply voltage VDDL are higher than or equal to the corresponding first or second target level, it means that power-on of both of the supply voltage VDDH and the supply voltage VDDL is completed. Thus, the voltage detection circuit may output the detection signal PG having a second logic level. In this case, the resistance adjustment circuit 130 and/or the comparator circuit 120 may be disabled and hence turn off some circuits according to the detection signal PG so as to reduce power consumption.

Figure 2:
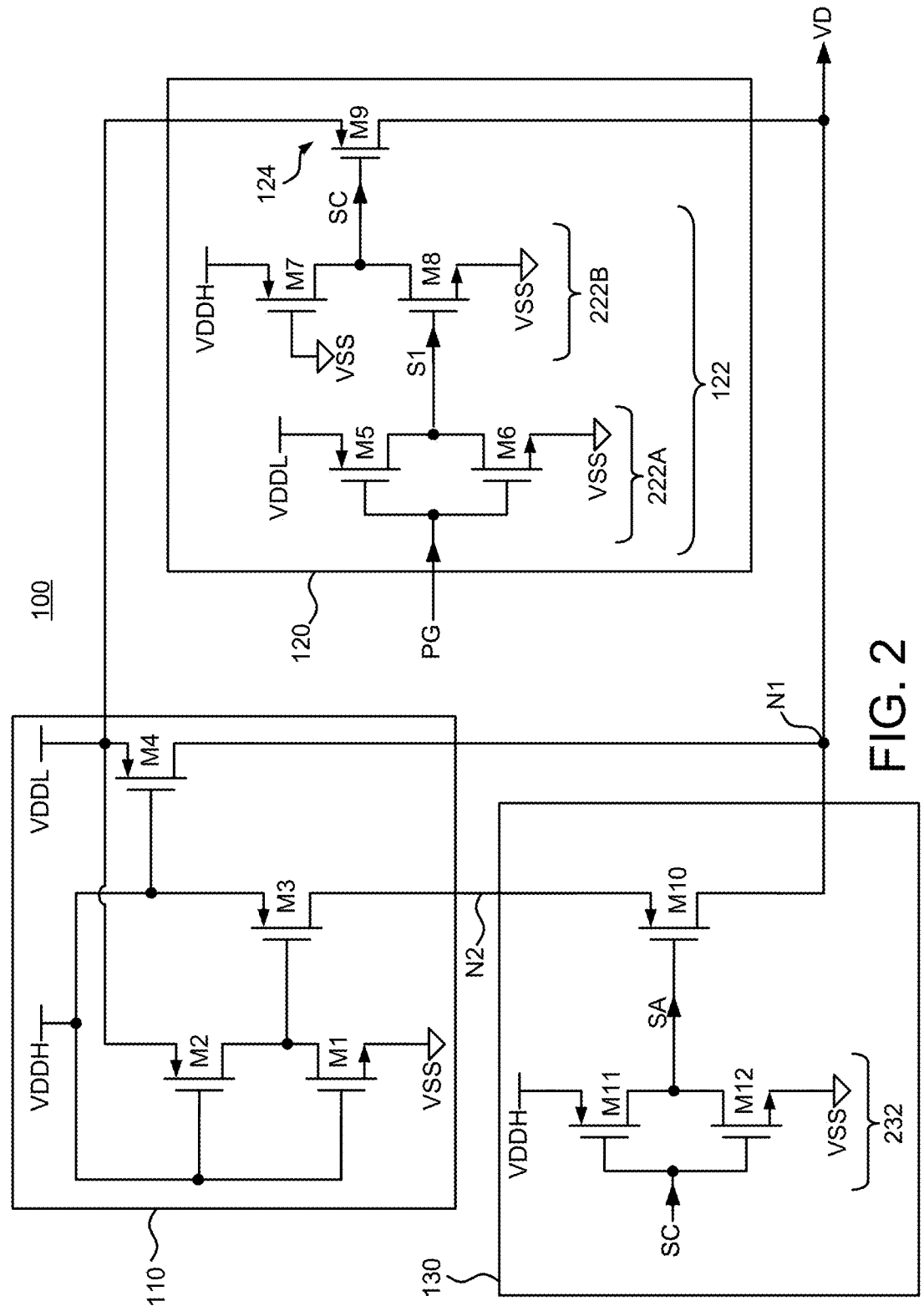
FIG. 2 is a circuit schematic diagram of the fail-safe input/output device in FIG. 1 according to some embodiments of the present application.

FIG. 2 shows a circuit schematic diagram of the fail-safe input/output device 100 in FIG. 1 according to some embodiments of the present application. In this example, the input/output circuit 110 includes multiple transistors M1 to M4. A first terminal (for example, the drain) of the transistor M1 is coupled to a second terminal (for example, the drain) of the transistor M2 and a control terminal (for example, the gate) of the transistor M3, a second terminal (for example, the source) of the transistor M1 receives a supply voltage VSS, and a control terminal of the transistor M1 receives the supply voltage VDDH. A first terminal (for example, the source) of the transistor M2 receives the supply voltage VDDL, and a control terminal of the transistor M2 receives the supply voltage VDDH. A first terminal of the transistor M3 receives the supply voltage VDDH, and a second terminal of the transistor M3 is coupled to the node N2. A first terminal of the transistor M4 receives the supply voltage VDDL, a second terminal of the transistor M4 is coupled to the node N1, and a control terminal of the transistor M4 receives the supply voltage VDDH.

In the above embodiments, the transistor M1 may be an N-type transistor (for example, an N-type MOSFET), and the multiple transistors M2 to M4 may be P-type transistors (for example, P-type MOSFETs). When the supply voltage VDDL is at the first target level and the level of the supply voltage VDDH is still lower than the second target level, the transistor M1 and the transistor M3 are turned off and the transistor M2 and the transistor M4 are turned on. In this case, the transistor M4 can transmit the supply voltage VDDL to the node as the driving voltage VD. Alternatively, when the level of the supply voltage VDDH is higher than or equal to the second target level, the transistor M2 and the transistor M4 are turned off and the transistor M1 and the transistor M3 are turned on. In this case, the transistor M3 can transmit the supply voltage VDDH to the node N1 via the node N2 as the driving voltage VD.

The comparator 122 includes an inverter 222A and an inverter 222B. The inverter 222A is driven by the driving voltage VDDL, and outputs a signal S1 according to the detection signal PG. The inverter 222B is driven by the driving voltage VDDH, and outputs a signal S2 according to the signal S1. More specifically, in some embodiments, the inverter 222A may be a CMOS inverter, and the inverter 222B may be a pseudo NMOS inverter (that is, the gate of the P-type transistor (for example, a transistor M7) in the inverter 222B is connected to ground). For example, the inverter 222A includes a transistor M5 and a transistor M6, and the inverter 222B includes a transistor M7 and a transistor M8, wherein the transistor M5 and the transistor M7 are P-type transistors, and the transistor M6 and the transistor M8 are N-type transistors. A first terminal of the transistor M5 receives the supply voltage VDDL, a second terminal of the transistor M5 is coupled to a first terminal of the transistor M6 and outputs the signal S1, control terminals of both of the transistor M5 and the transistor M6 receive the detection signal PG, and a second terminal of the transistor M6 receives the supply voltage VSS. A first terminal of the transistor M7 receives the supply voltage VDDH, a second terminal of the transistor M7 is coupled to a first terminal of the transistor M7 and outputs the control signal SC, a control terminal of the transistor M7 receives the supply voltage VSS, a control terminal of the transistor M8 receives the signal S1, and a second terminal of the transistor M8 receives the supply voltage VSS.

On the other hand, the switch 124 may include a transistor M9, which may be a P-type transistor. A first terminal of the transistor M9 receives the supply voltage VDDL, a second terminal of the transistor M9 is coupled to the node N1, and a control terminal of the transistor M9 receives the control signal SC. With the configuration above, when the detection signal PG is at a first logic level (for example, logic 0), the inverter 222A may output the supply voltage VDDL as the signal S1. In this case, if the level of the supply voltage VDDH is not sufficiently high, the inverter 222B may output the control signal SC having a low level (equivalent to the supply voltage VSS), thereby turning on the transistor M9. Thus, the switch 124 can transmit the supply voltage VDDL to the node N1 as the driving voltage VD. Alternatively, when the detection signal PG is at a second logic level (for example, logic 1), the inverter 222A may output the signal S1 having a low level. In this case, the transistor M8 is turned off, and the transistor M7 may output the control signal SC having a high level (equivalent to the supply voltage VDDH), thereby turning off the transistor M9. Thus, the supply voltage VDDL cannot be transmitted to the node N1 via the transistor M9, and the comparator 122 and the multiple transistors in the switch 124 are turned off, so as to reduce power consumption.

The resistance adjustment circuit 130 includes an inverter 232 and a transistor M10. The inverter 232 is driven by the driving voltage VDDH, and generates an adjustment signal SA according to the control signal SC. More specifically, the inverter 232 includes a transistor M11 and a transistor M12, wherein the transistor M10 and the transistor M11 may be P-type transistors, and the transistor M12 may be an N-type transistor. A first terminal of the transistor M11 receives the supply voltage VDDH, a second terminal of the transistor M11 is coupled to a first terminal of the transistor M12 and outputs the adjustment signal SA, the control terminals both of the transistor M11 and the transistor M12 receive the control signal SC, and a second terminal of the transistor M12 receives the supply voltage VSS.

A first terminal of the transistor M10 is coupled to the node N2, a second terminal of the transistor M10 is coupled to the node N1, and a control terminal of the transistor M10 receives the adjustment signal SA. During power-on, the transistor M10 is controlled by the adjustment signal SA and provides the resistance described above. Before the supply voltage VDDH gets higher than the supply voltage VDDL, this resistance changes along with the driving voltage VD and increases, thereby ensuring that no current is flows back from the node N1 to the node N2 during power-on, further ensuring that the input/output circuit 110 does not simultaneously transmit the supply voltage VDDH and the supply voltage VDDL to the node N1. Thus, non-ideal instantaneous voltage drop in the driving voltage VD and hence incorrect potential jump in the supply voltage VDDH can be avoided, thereby enhancing the overall reliability and operation accuracy of the main circuit 100A.

Figure 3:
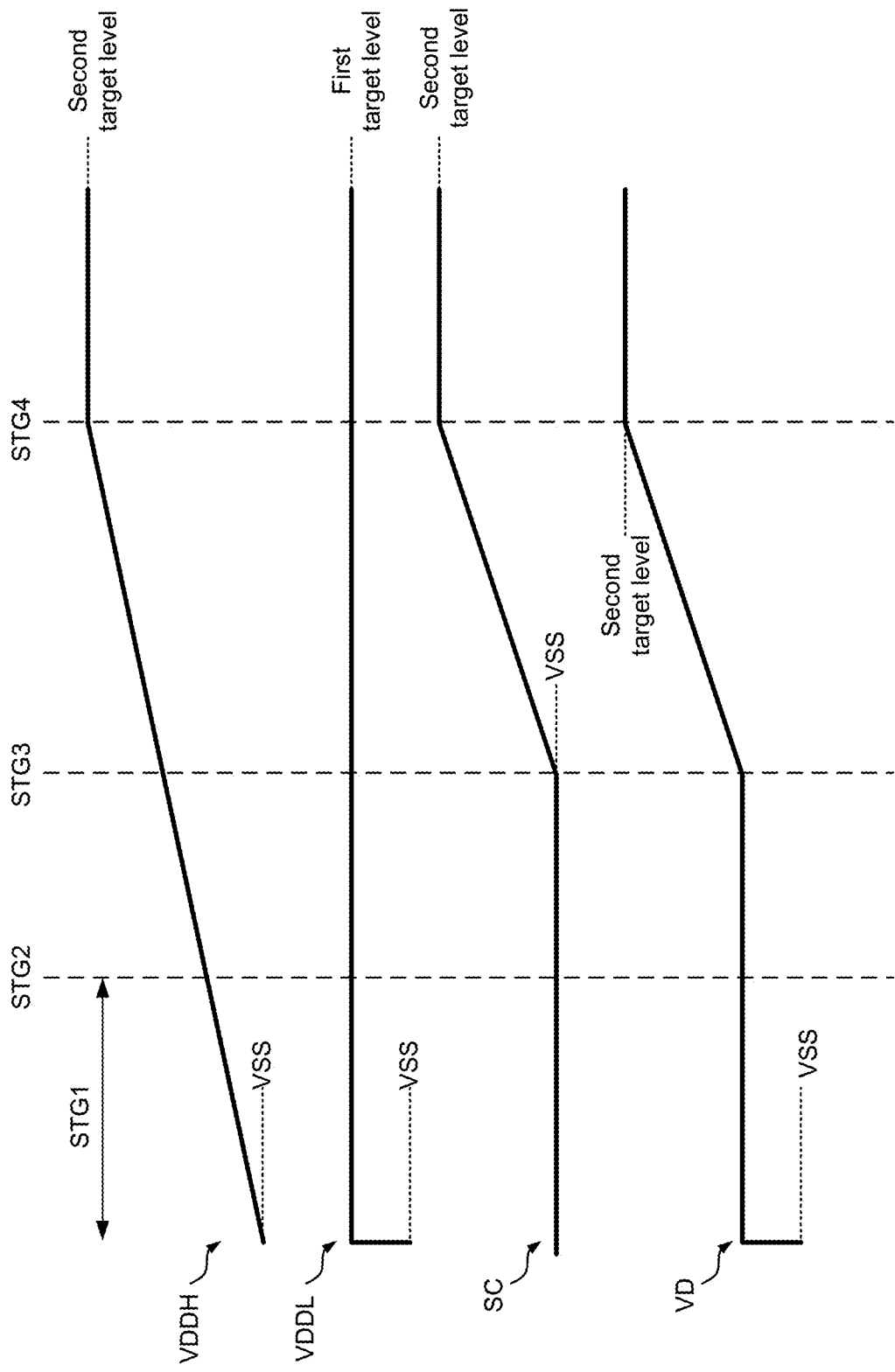
FIG. 3 is a waveform timing diagram of part of signals in FIG. 2 according to some embodiments of the present application.
Figure 4A:
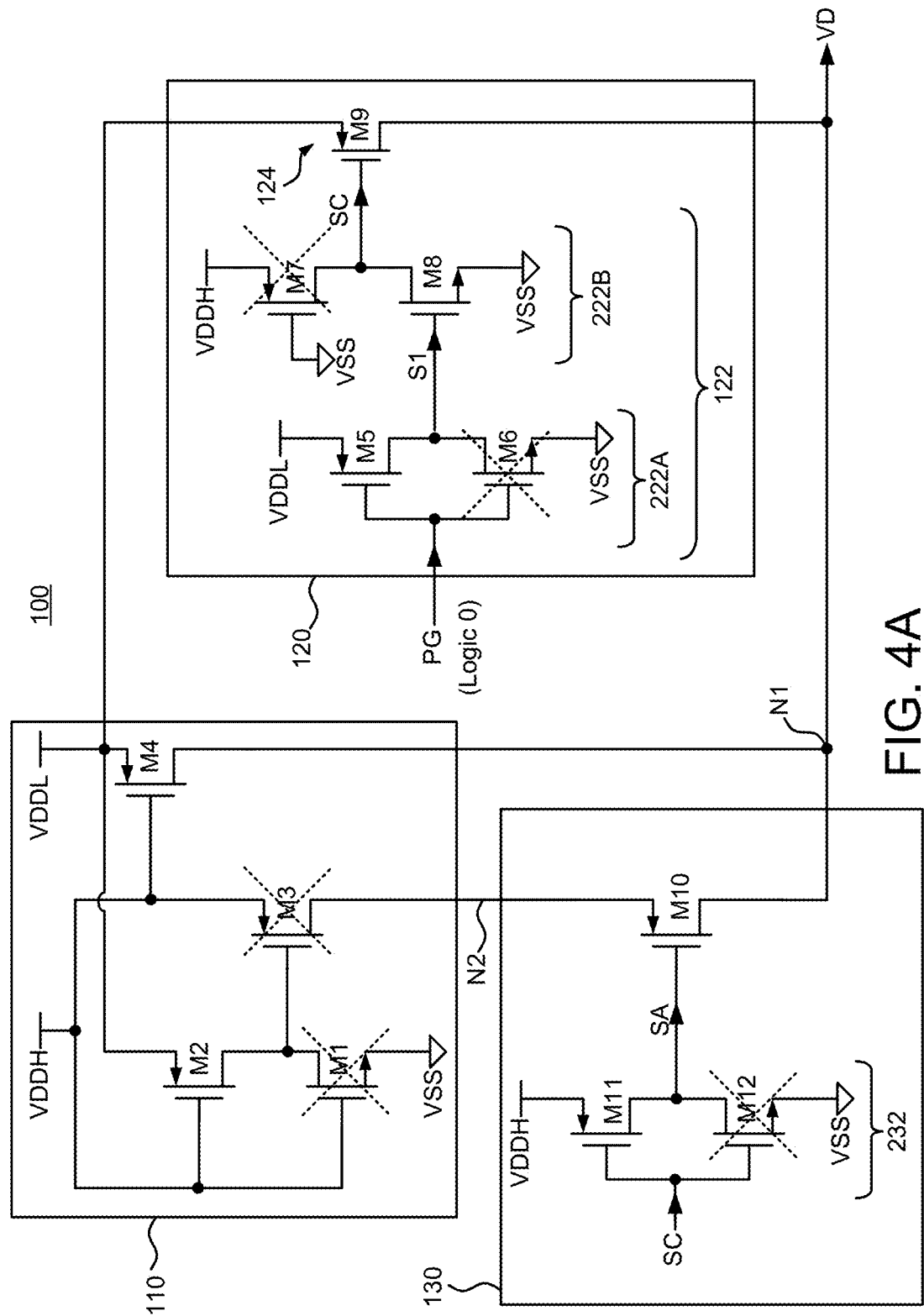
FIG. 4A is an operation schematic diagram of the fail-safe input/output device in FIG. 2 operating in a first stage according to some embodiments of the present application.

FIG. 3 shows a waveform timing diagram of part of signals in FIG. 2 during power-on according to some embodiments of the present application. In this example, it is assumed that during power-on of the fail-safe input/output device 100, the level of the supply voltage VDDL first rises to the first target level and the level of the supply voltage VDDL later rises to the second target level. According to circuit operation conditions, this process of power-on can be divided into multiple stages STG1 to STG4. In the stage STG1, the level of the supply voltage VDDL is at the first target level, and the supply voltage VDDH is rising but has not yet reached the second target level. Also refer to FIG. 4A. FIG. 4A shows an operation schematic diagram of the fail-safe input/output device 100 in FIG. 2 operating in the stage STG1 in FIG. 3 according to some embodiments of the present application. As shown in FIG. 4, in response to the supply voltage VDDH and the supply voltage VDDL in the stage STG1, the transistor M2 and the transistor M4 are turned on, and the transistor M1 and the transistor M3 are turned off (represented by "X" in dotted lines). In this case, the supply voltage VDDL can be transmitted to the node N1 via the transistor M4. Thus, the level of the driving voltage VD is equal to the level of the supply voltage VDDL.

On the other hand, since the power voltage VDDH has not yet reached the second target level, the detection signal PG is at logic 0. In this case, the inverter 222A is enabled and outputs the signal S1 having a level equal to that of the supply voltage VDDL, and the inverter 222B generates the control signal SC having a low level, thereby turning on the switch 124. As such, the supply voltage VDDL can be transmitted to the node N1 via the switch 124. In other words, in the stage STG1, the supply voltage VDDL can be transmitted to the node N1 via two paths (that is, the turned-on transistor M4 and switch 124), as the driving voltage VD. Moreover, in response to the control signal SC having a low level, the inverter 232 can generate the adjustment signal SA having a level equal to that of the supply voltage VDDH. Since the supply voltage VDDH has a low level in the stage STG1, the transistor M10 is turned on. No current flows back from the node N1 to the node N2 because the transistor M3 is turned off.

Figure 4B:
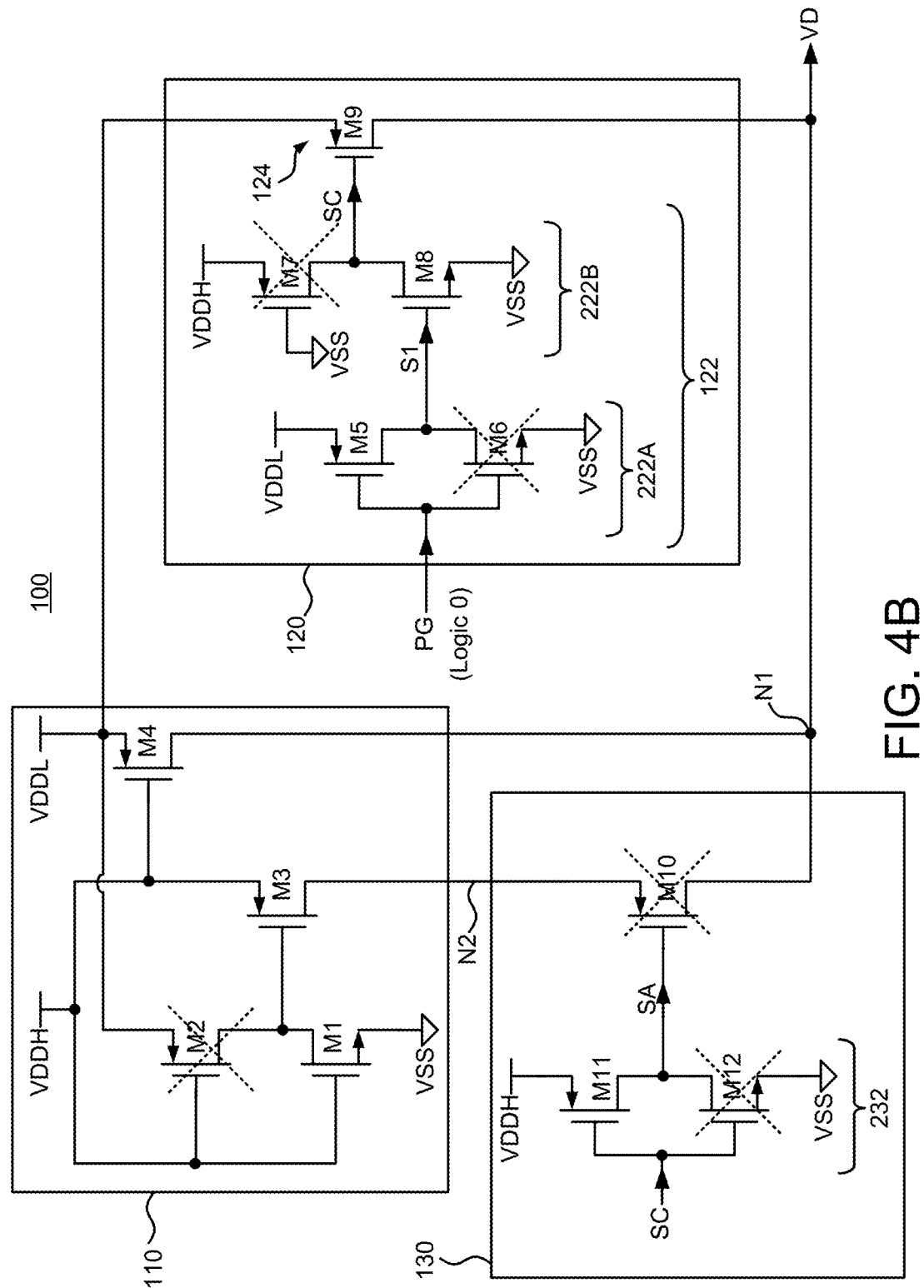
FIG. 4B is an operation schematic diagram of the fail-safe input/output device in FIG. 2 operating in a second stage according to some embodiments of the present application.

Again referring to FIG. 3, in the stage STG2, the level of the supply voltage VDDH continues rising but has not yet reached the second target level. Also refer to FIG. 4B. FIG. 4B shows an operation schematic diagram of the fail-safe input/output device 100 in FIG. 2 operating in the stage STG2 in FIG. 3 according to some embodiments of the present application. As shown in FIG. 4B, in response to the supply voltage VDDH and the supply voltage VDDL in the stage STG2, the transistor M2 switches to be turned off, and the transistor M1 and the transistor M3 switch to be turned on. On the other hand, because the supply voltage VDDH continues rising, the level of the adjustment signal SA also continues rising, such that the transistor M10 gradually switches to be turned off (that is, the resistance provided by the transistor M10 continues rising). As such, in the stage STG2, the transistor M10 can ensure that no current flows back from the node N1 to the node N2, while the driving voltage VD is still equal to the supply voltage VDDL.

Figure 4C:
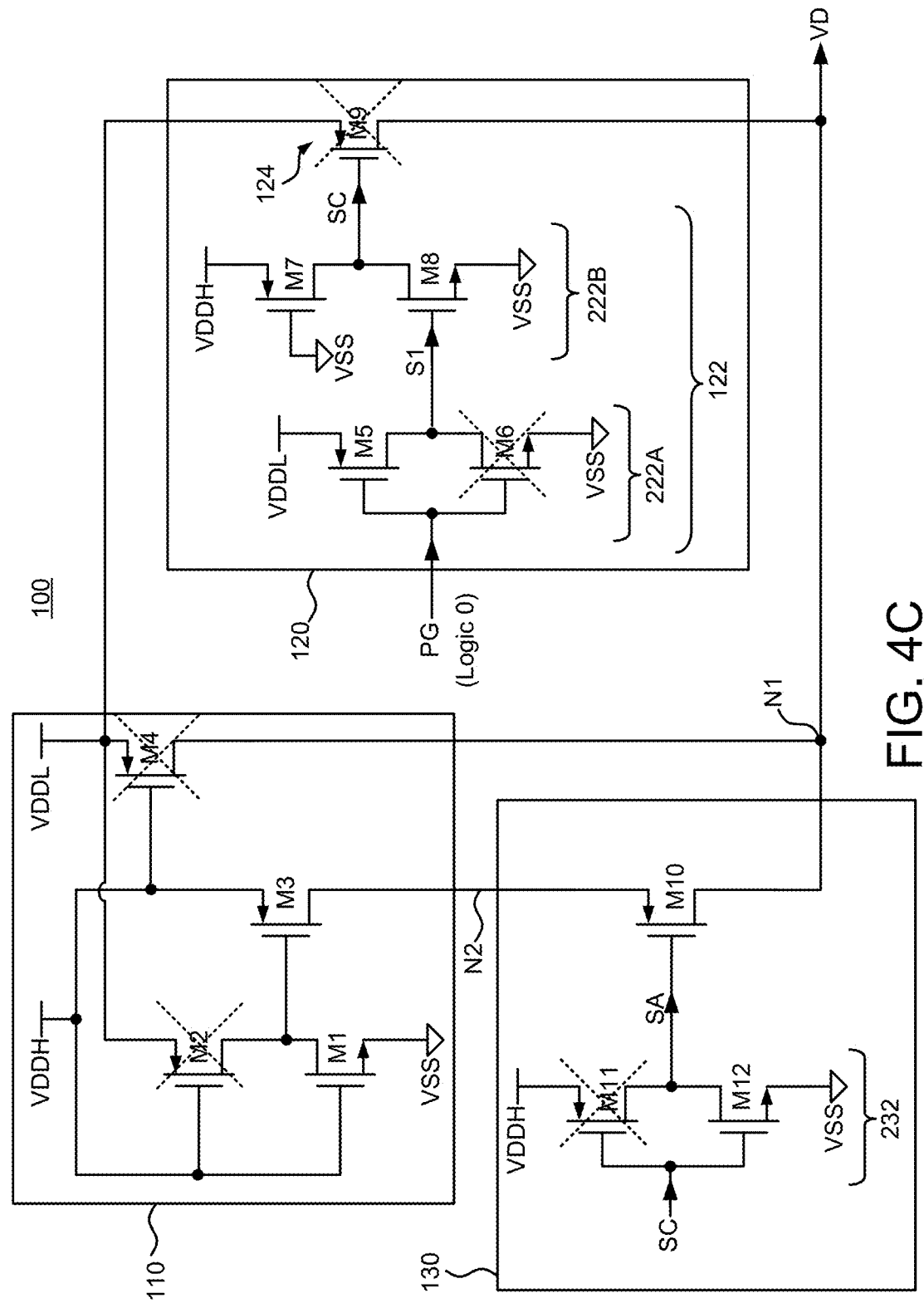
FIG. 4C is an operation schematic diagram of the fail-safe input/output device in FIG. 2 operating in a third stage according to some embodiments of the present application.

Again referring to FIG. 3, in the stage STG3, the level of the supply voltage VDDH continues rising and becomes higher than that of the supply voltage VDDL. Also refer to FIG. 4C. FIG. 4C shows an operation schematic diagram of the fail-safe input/output device 100 in FIG. 2 operating in the stage STG3 in FIG. 3 according to some embodiments of the present application. As shown in FIG. 4C, in response to the supply voltage VDDH and the supply voltage VDDL in the stage STG3, the transistor M4 switches to be turned off. On the other hand, the transistor M7 is turned on such that the inverter 222B outputs the control signal SC having a level equal to that of the supply voltage VDDH, and the switch 124 becomes turned off. Moreover, in response to the control signal SC above, the inverter 232 outputs the adjustment signal SA having a low level, thereby turning on the transistor M10. As such, in the stage STG3, the supply voltage VDDL can no longer be transmitted to the node N1 via the transistor M4 and/or the switch 124, and the supply voltage VDDH can be transmitted to the node N1 via the transistor M3 and the transistor M10, such that the level of the driving voltage VD is equal to that of the supply voltage VDDH.

Figure 4D:
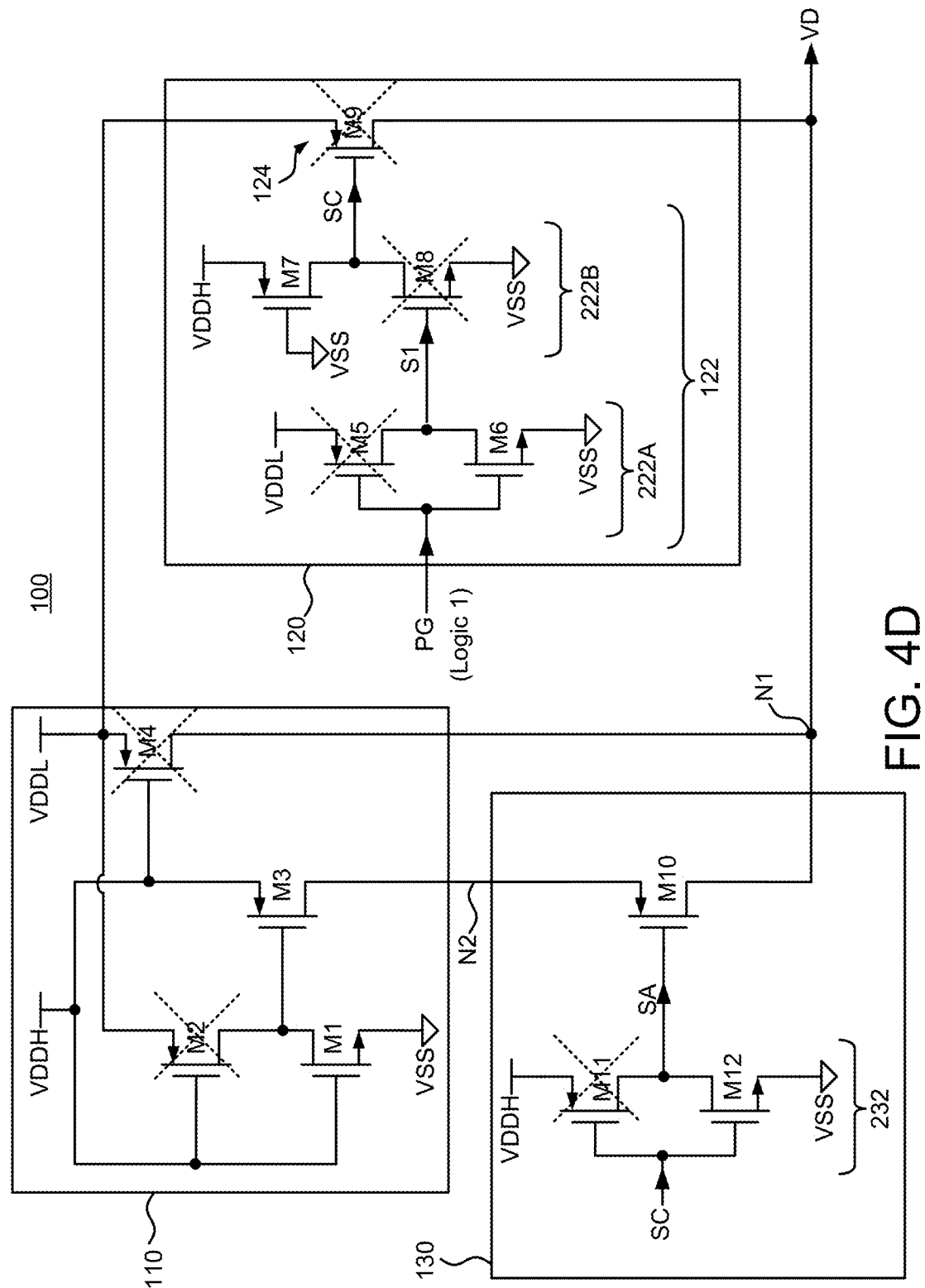
FIG. 4D is an operation schematic diagram of the fail-safe input/output device in FIG. 2 operating in a fourth stage according to some embodiments of the present application.

Again referring to FIG. 3, in the stage STG4, the level of the supply voltage VDDH is stabilized at the second target level and the level of the supply voltage VDDL is stabilized at the first target level. Also refer to FIG. 4D. FIG. 4D shows an operation schematic diagram of the fail-safe input/output device 100 in FIG. 2 operating in the stage STG4 in FIG. 3 according to some embodiments of the present application. As described above, when the level of the supply voltage VDDH is stabilized at the second target level and the level of the supply voltage VDDL is stabilized at the first target level, the detection signal PG switches to a second logic level (for example, logic 1). In response to this detection signal PG, the inverter 222A outputs the signal S1 having a low level, and the inverter 222B continues outputting the control signal SC having a level equal to that of the supply voltage VDDH, thereby turning off the switch 124. In other words, in the stage STG4, part of transistors and/or switches in the comparator circuit 120 are turned off in response to the detection signal PG. It is equivalently said that the comparator circuit 120 can be disabled in response to the detection signal PG, thus reducing power consumption. Similarly, part of transistors (for example, the transistor M11) in the resistance adjustment circuit 130 can be disabled according to the detection signal PG, such that the resistance adjustment circuit 130 can be disabled in response to the detection signal PG so as to reduce power consumption. Since the remaining circuits are still performing the operations in the previous stage STG3, the driving voltage VD can be kept as equal to the supply voltage VDDH.

In the process of power-on above, it is known that no current back flows from the node N1 to N2 in any of the stages STG1 to STG4. More specifically, before the supply voltage VDDH rises to be higher than the supply voltage VDDL (that is, the stage STG1 and the stage STG2), the resistance (equivalent to the equivalent resistance of the transistor M10) of the resistance adjustment circuit 130 can increase as the driving voltage VD increases, so as to prevent a current backflow. Once the supply voltage VDDH has risen to be higher than the supply voltage VDDL (that is, the stage STG3 and the stage STG4), the resistance decreases (for example, the transistor M10 becomes turned on), such that the input/output circuit 100 can transmit the supply voltage VDDH to the node N1 by the resistance adjustment circuit 130 so as to output the supply voltage VDDH as the driving voltage VD. Moreover, in the process of power-on above, the supply voltage VDDH and the supply voltage VDDL are not simultaneously transmitted to the node N1, and before the supply voltage VDDH rises to the second target level, the transistor M3 or the transistor M10 is turned off. Thus, any non-ideal voltage drop in the driving voltage VD and hence unexpected potential jump in the supply voltage VDDH can be avoided, thereby enhancing the reliability of the main circuit 100A. In equivalence, the comparator circuit 120 and the resistance adjustment circuit 130 form a fail-safe mechanism, so as to ensure that the input/output circuit 110 operates in a way that one of the supply voltage VDDH and the supply voltage VDDL that has a higher level is output as the driving voltage VD during power on.

In some related art, an input/output circuit selectively outputs one of the supply voltage VDDH and the supply voltage VDDL as the driving voltage while no fail-safe mechanism is adopted. For example, in such related art, the second terminals of the transistor M3 and the transistor M4 are directly connected to the node N1 so as to output the driving voltage VD. In this case, when the level of the supply voltage VDDH rises to be equal to a threshold voltage of the transistor M1, the transistor M3 and the transistor M4 may be erroneously turned on at the same time in a way that the supply voltage VDDH and the supply voltage VDDL are both transmitted to the node N1, resulting in an incorrect voltage drop in the driving voltage VD due to voltage dividing of the transistor M3 and the transistor M4. Moreover, since the transistor M4 and the transistor M3 form a path, it is possible that a current flows back from the transistor M4 to the transistor M3 to generate an unexpected jump in the level of the supply voltage VDDH. As a result, the system and/or the main circuit 100A may become unstable.

Compared to the prior art above, in some embodiments of the present invention as described above, the comparator circuit 120 and the resistance adjustment circuit 130 are provided to prevent the current from flowing back from the node N1 to the node N2, and to prevent an unexpected jump in the supply voltage VDDH. Thus, operations of the system and the main circuit 100A may be made more stable.

In addition, in some other circumstances, if the supply voltage VDDH rises to the second target level earlier than the supply voltage VDDL rises to the first target level during power-on, the operation of the fail-safe input/output device 100 is the same as the operation shown in FIG. 4C. Thus, the fail-safe input/output device 100 can still output the supply voltage VDDH having a higher level as the driving voltage VD.

FIG. 5 shows a flowchart of a voltage switching method 500 according to some embodiments of the present application. In some embodiments, the voltage switching method 500 is applicable in a system with multi-level power applications. In operation S510, a voltage having a higher voltage level in a first supply voltage and a second supply voltage is transmitted by an input/output circuit to a first node to generate a driving voltage, wherein a first target level of the first supply voltage is lower than a second target level of the second supply voltage. In operation S520, the first supply voltage is compared with the second supply voltage to generate a control signal, and the first supply voltage is selectively transmitted to the first node according to the control signal. In operation S530, a resistance between the first node and a second node is adjusted according to the second supply voltage, wherein the input/output circuit transmits the second supply voltage to the first node via the second node.

Details associated with the multiple operations of the voltage switching method 500 above can be referred from the details of the embodiments above, and are omitted herein. The multiple operations of the voltage switching method 500 above are merely examples, and are not limited to being performed in the order specified in these examples. Without departing from the operation means and ranges of the various embodiments of the present application, additions, replacements, substitutions or omissions may be made to the operations of the voltage switching method 500, or the operations may be performed in different orders (for example, simultaneously performed or partially simultaneously performed).

In conclusion, the fail-safe input/output device and the voltage switching method according to some embodiments of the present application are capable of ensuring that multiple supply voltages can be correctly output as a driving voltage of other circuits in the system during power-on, and at the same time preventing an unexpected voltage drop or jump from occurring in the driving voltage or the supply voltages. Thus, the overall system reliability can be enhanced.

While the present application has been described by way of example and in terms of the preferred embodiments, it is to be understood that the disclosure is not limited thereto. Various modifications made be made to the technical features of the present application by a person skilled in the art on the basis of the explicit or implicit disclosures of the present application. The scope of the appended claims of the present application therefore should be accorded with the broadest interpretation so as to encompass all such modifications.

What is claimed is:

1. A fail-safe input/output device, comprising:
   an input/output circuit, transmitting a voltage having a higher voltage level in a first supply voltage and a second supply voltage to a first node to generate a driving voltage, wherein a first target level of the first supply voltage is lower than a second target level of the second supply voltage;
   a comparator circuit, comparing the first supply voltage with the second supply voltage to generate a control signal, and selectively transmitting the first supply voltage to the first node according to the control signal; and
   a resistance adjustment circuit, adjusting a resistance between the first node and a second node according to the second supply voltage, wherein the input/output circuit transmits the second supply voltage to the first node via the second node.

2. The fail-safe input/output device according to claim 1, wherein the comparator circuit and the resistance adjustment circuit are disabled according to a detection signal, and the detection signal is for indicating whether a level of the first supply voltage is higher than or equal to the first target level and indicating whether a level of the second supply voltage is higher than or equal to the second target level.

3. The fail-safe input/output device according to claim 1, wherein the comparator circuit comprises:
   a comparator, comparing the first supply voltage with the second supply voltage according to a detection signal to generate the control signal; and
   a switch, selectively transmitting the first supply voltage to the first node according to the control signal.

4. The fail-safe input/output device according to claim 3, wherein the comparator comprises:
   a first inverter, driven by the first supply voltage, and outputting a first signal according to the detection signal; and
   a second inverter, driven by the second supply voltage, and outputting the control signal according to the first signal.

5. The fail-safe input/output device according to claim 4, wherein a gate of a P-type transistor in the second inverter is connected to ground.

6. The fail-safe input/output device according to claim 1, wherein the resistance adjustment circuit is further selectively disabled according to the control signal.

7. The fail-safe input/output device according to claim 1, wherein the resistance adjustment circuit comprises:
   an inverter, driven by the second supply voltage, and generating an adjustment signal according to the control signal; and
   a transistor, coupled between the first node and the second node, and controlled by the adjustment signal so as to adjust the resistance.

8. The fail-safe input/output device according to claim 7, wherein the transistor is turned on when the second supply voltage is higher than the first supply voltage.

9. The fail-safe input/output device according to claim 1, wherein before the second supply voltage is higher than the first supply voltage, the resistance increases as the driving voltage rises.

10. A voltage switching method, comprising:
    transmitting a voltage having a higher voltage level in a first supply voltage and a second supply voltage to a first node by an input/output circuit to generate a driving voltage, wherein a first target level of the first supply voltage is lower than a second target level of the second supply voltage;
    comparing the first supply voltage with the second supply voltage to generate a control signal, and selectively transmitting the first supply voltage to the first node according to the control signal; and
    adjusting a resistance between the first node and a second node according to the second supply voltage, wherein the input/output circuit transmits the second supply voltage to the first node via the second node.

* * * * *